(12) United States Patent
Bruzda et al.

(10) Patent No.: US 10,306,817 B2
(45) Date of Patent: May 28, 2019

(54) THERMAL MANAGEMENT AND/OR EMI MITIGATION MATERIALS WITH CUSTOM COLORED EXTERIOR SURFACES

(71) Applicant: Laird Technologies, Inc., Earth City, MO (US)

(72) Inventors: Karen J. Bruzda, Cleveland, OH (US); Troy Dewayne Derksen, Big Lake, MN (US); David B. Wood, St. Louis, MO (US)

(73) Assignee: Laird Technologies, Inc., Earth City, MO (US)

( * ) Notice: Subject to any disclaimer, the term of this patent is extended or adjusted under 35 U.S.C. 154(b) by 52 days.

(21) Appl. No.: 15/869,593

(22) Filed: Jan. 12, 2018

(65) Prior Publication Data
US 2018/0139874 A1 May 17, 2018

Related U.S. Application Data

(63) Continuation of application No. PCT/US2016/041891, filed on Jul. 12, 2016.
(Continued)

(51) Int. Cl.
*H05K 9/00* (2006.01)
*H01L 23/552* (2006.01)
(Continued)

(52) U.S. Cl.
CPC ......... *H05K 9/0081* (2013.01); *H01L 23/373* (2013.01); *H01L 23/544* (2013.01);
(Continued)

(58) Field of Classification Search
CPC ...... H05K 9/0081; H05K 1/0201; H05K 9/00; H01L 23/36; H01L 23/552; H01S 3/00
(Continued)

(56) References Cited

U.S. PATENT DOCUMENTS 5,416,667 A * 5/1995 Ichikawa .................. F42B 3/18
174/250
6,657,297 B1 12/2003 Jewram et al.
(Continued)

FOREIGN PATENT DOCUMENTS

CN 102985510 A 3/2013

OTHER PUBLICATIONS

International Search Report and Written Opinion for PCT App. No. PCT/US2016/041891 filed Jul. 12, 2016 which is the parent application to the instant application; dated Oct. 12, 2016, 14 pages.
(Continued)

*Primary Examiner* — Rockshana D Chowdhury
(74) *Attorney, Agent, or Firm* — Harness, Dickey & Pierce, P.L.C.; Anthony G. Fussner (57) ABSTRACT

Disclosed are exemplary embodiments of thermal management and/or EMI (electromagnetic interference) mitigation materials with modified or custom colored exterior surfaces. The thermal management and/or EMI mitigation materials disclosed herein may comprise thermal interface materials (e.g., thermally-conductive pads or gap fillers, thermally-conductive dielectric materials, etc.), EMI shielding materials (e.g., EMI suppression materials, electrically-conductive thermal insulators, EMI absorbers etc.), microwave absorbers (e.g., microwave absorbing elastomers, microwave absorbing foams, EMI/RF/microwave absorbers, etc.), combinations thereof, etc. The thermal management and/or EMI mitigation materials disclosed herein may comprise combined thermal management and EMI mitigation materials, such as hybrid thermal/EMI absorbers, thermally-conductive microwave absorbers, hybrid absorber/thermal management materials usable for EMI mitigation, combined thermal interface and EMI shielding materials (e.g., thermally-conductive and electrically-conductive materials,
(Continued)

thermally-conductive and EMI shielding/absorbing materials, etc.), etc.

17 Claims, 4 Drawing Sheets

Related U.S. Application Data (60) Provisional application No. 62/214,080, filed on Sep. 3, 2015, provisional application No. 62/191,876, filed on Jul. 13, 2015.

(51) Int. Cl.
    *H01S 3/00*     (2006.01)
    *H05K 1/02*     (2006.01)
    *H01L 23/373*     (2006.01)
    *H01L 23/544*     (2006.01)
    *H01L 23/42*     (2006.01)

(52) U.S. Cl.
    CPC .............. *H01L 23/552* (2013.01); *H01S 3/00* (2013.01); *H05K 1/0201* (2013.01); *H05K 9/00* (2013.01); *H01L 23/42* (2013.01); *H01L 2223/54406* (2013.01); *H01L 2223/54413* (2013.01); *H01L 2223/54433* (2013.01); *H01L 2223/54486* (2013.01)

(58) Field of Classification Search
    USPC ........................................................ 361/704
    See application file for complete search history.

(56) References Cited

U.S. PATENT DOCUMENTS

| | | | |
|---|---|---|---|
| 6,835,453 B2 | 12/2004 | Greenwood et al. | |
| 6,921,431 B2 | 7/2005 | Evans et al. | |
| 7,208,192 B2 | 4/2007 | Bunyan et al. | |
| 8,354,658 B1 * | 1/2013 | Smith | G21F 1/125 250/515.1 |
| 8,758,892 B2 | 6/2014 | Bergin et al. | |
| 9,161,483 B2 * | 10/2015 | Aso | H05K 9/0045 |
| 2006/0081389 A1 * | 4/2006 | Pille | H05K 5/0243 174/381 |
| 2006/0228542 A1 * | 10/2006 | Czubarow | H01L 23/3737 428/323 |
| 2007/0054105 A1 * | 3/2007 | Hsiao | H01L 23/3733 428/292.1 |
| 2007/0219312 A1 | 9/2007 | David | |
| 2009/0016025 A1 | 1/2009 | Johnson | |
| 2009/0166854 A1 * | 7/2009 | Jewram | F28F 13/00 257/713 |
| 2012/0015687 A1 * | 1/2012 | Yamada | H01L 23/3128 455/550.1 |
| 2012/0133072 A1 | 5/2012 | Bunyan et al. | |
| 2012/0157600 A1 | 6/2012 | Saga | |
| 2013/0221266 A1 | 8/2013 | Lu et al. | |
| 2013/0265721 A1 | 10/2013 | Strader et al. | |
| 2014/0262191 A1 | 9/2014 | Strader et al. | |
| 2015/0008361 A1 | 1/2015 | Hattori | |
| 2015/0029419 A1 * | 1/2015 | Huang | G09F 23/00 349/12 |

OTHER PUBLICATIONS

Silicone Inks Ltd., siliconeinks.com/products; accessed Jul. 15, 2015, 2 pages.
CHT Alpaprint Silicone User Guide, http://www.aimsupply.net/siliconeinks.htm, accessed Jul. 15, 2015, 1 page.
Tflex HR600 Serires, Thermal Gap filler, Oct. 2009, http://www.lairdtech.com/brandworld/library/THR-DS-Tflex%20HR600%201109.pdf>, 2 pages.
Hybrid Absorbers, <http://www.lairdtech.com/product-categories/rfmicrowave-absorbers-dielectrics/hybrid-absorbers>, Copyright 2016, 3 pges.
Tflex 700 Series, Thermal Gap Filler, <http://www.lairdtech.com/brandworld/library/THR-DS-TFlex-700_07_2_14.pdf> Jul. 2014, 2 pages.
Microwave Absorbing Materials Solutions, <http://media.digikey.com/pdf/Data%20Sheets/Laird%20Technologies/EMI_MicroAbsorb_Cat.pdf>, Copyright 2011, 15 pages.

* cited by examiner

THERMAL MANAGEMENT AND/OR EMI MITIGATION MATERIALS WITH CUSTOM COLORED EXTERIOR SURFACES

CROSS-REFERENCE TO RELATED APPLICATIONS

This application is a U.S. continuation application that claims priority to and the benefit of PCT International Application No. PCT/US2016/041891 filed Jul. 12, 2016 (published as WO 2017/011453 published Jan. 19, 2017, which, in turn, claims priority to and the benefit of U.S. Provisional Patent Application No. 62/191,876 filed Jul. 13, 2015 and U.S. Provisional Patent Application No. 62/214,080 filed Sep. 3, 2015. The entire disclosures of the above applications are incorporated herein by reference.

FIELD

The present disclosure relates to thermal management and/or EMI (electromagnetic interference) mitigation materials with modified or custom colored exterior surfaces.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and is not intended to limit the scope of the present disclosure.

DETAILED DESCRIPTION

Example embodiments will now be described more fully with reference to the accompanying drawings.

The inventors hereof have recognized a need for thermal management and/or EMI mitigation materials having exterior surfaces that are modified or customized, e.g., color customization, etc. The thermal management and/or EMI mitigation materials disclosed herein may comprise thermal interface materials (e.g., thermally-conductive pads or gap fillers, thermally-conductive dielectric materials, etc.), EMI shielding materials (e.g., EMI suppression materials, electrically-conductive thermal insulators, EMI absorbers etc.), microwave absorbers (e.g., microwave absorbing elastomers, microwave absorbing foams, EMI/RF/microwave absorbers, etc.), combinations thereof, etc. The thermal management and/or EMI mitigation materials disclosed herein may comprise combined thermal management and EMI mitigation materials, such as hybrid thermal/EMI absorbers, thermally-conductive microwave absorbers, hybrid absorber/thermal management materials usable for EMI mitigation, combined thermal interface and EMI shielding materials (e.g., thermally-conductive and electrically-conductive materials, thermally-conductive and EMI shielding/absorbing materials), etc.

Conventionally, a thermal interface material (TIM) may be provided or made in only one color, which is set by either a pigment in the TIM formulation or by the natural color of the filler(s) (e.g., thermally-conductive filler, etc.) used in the TIM formulation. Similarly, a conventional EMI shielding material or absorber may also be provided or made in only one color, which is also set by either a pigment in the formulation or by the natural color of the filler(s) (e.g., electrically-conductive fillers, EMI absorbing particles, etc.) used in the formulation.

The inventors have recognized an increased use of automated visual detection systems to confirm whether or not a material, such as a thermal interface material, has been correctly installed or placed in an application. This increased use may be due in part to how easily human eyes may become fatigued when used instead of an automated vision system.

For example, an automated vision system works most effectively when there is a significant difference in color and/or contrast between the thermal interface material and the substrate on which the thermal interface material is placed. An automated vision system may not be able to detect a thermal interface material and its relative positioning on a substrate if the exterior surface(s) of the thermal interface material (e.g., an exposed, upwardly facing exterior surface, etc.) is the same color as the exterior surface(s) of the substrate (e.g., an exposed, upwardly facing portion of the substrate surface adjacent the thermal interface material, etc.). If a thermal interface material is missing or incorrectly placed, this could result in overheating of and damage to the electronic device. The vision system may instead just be human eyes, in which case the difference in color and/or contrast may advantageously allow a person to more easily and quickly determine at a glance that all thermal interface materials are in place.

In addition to colored materials (e.g., thermal management and/or EMI mitigation materials, etc.) being more easily detected by an automated vision detection system, the inventors hereof have also recognized other reasons why their custom colored thermal management and/or EMI mitigation materials may be requested or desired. For example, custom coloration of a thermal management and/or EMI mitigation material may be requested purely for aesthetic reasons. By way of further example, customized colorization of a thermal management and/or EMI mitigation material may also be useful for differentiating different materials from each other, matching a competitor's material, differentiating thicknesses to avoid confusion, differentiating one face of the thermal management and/or EMI mitigation material from the other, making counterfeiting activity more difficult, etc. Moreover, sometimes a commercially available color is not acceptable.

After recognizing the above, the inventors hereof developed and disclose exemplary embodiments (e.g., FIG. 6, etc.) of thermal management and/or EMI mitigation materials having custom colored exterior surfaces. The thermal management and/or EMI mitigation materials disclosed herein may have exterior surfaces that are customized, tailored, or custom colored to have one or more predetermined colors (e.g., one or more colors different than a pre-existing color of the thermal interface material, etc.). For example, a thermal interface material may have a natural grey color without any coloring pigment added (e.g., thermal interface material 100 shown in FIG. 1, etc.). According to exemplary embodiments disclosed herein, one or more portions of (or the entirety of) of one or more of (or all of) the thermal interface material's grey colored exterior surface(s) may be modified or custom colored, e.g., green (e.g., thermal interface material 200 shown in FIG. 2, etc.), blue (e.g., thermal interface material 300 shown in FIG. 3, etc.), black (e.g., thermal interface material 400 shown in FIG. 4, etc.), pink (e.g., thermal interface material 500 shown in FIG. 5, etc.), etc.

As used herein, thermal management and/or EMI mitigation materials include EMI mitigation materials that are operable for providing EMI mitigation but which are not good thermal conductors, such as electrically-conductive thermal insulators, EMI absorbing/suppressing thermal insulators, microwave absorbing/suppressing thermal insulators, etc. Additionally, thermal management and/or EMI mitigation materials include thermal interface materials that do not provide any EMI shielding, such as thermally-conductive dielectric pads or gap fillers, thermally-conductive electric insulators, thermally-conductive dielectric materials, etc. Further, the thermal management and/or EMI mitigation materials include hybrid or combined thermal management and EMI mitigation materials that are operable for both EMI mitigation and thermal management, such as hybrid thermal/EMI absorbers, thermally-conductive microwave absorbers, hybrid absorber/thermal management materials usable for EMI mitigation, combined thermal interface and EMI shielding materials (e.g., thermally-conductive and electrically-conductive materials, thermally-conductive and EMI shielding/absorbing/suppressing materials, etc.), etc.

Figure 7:
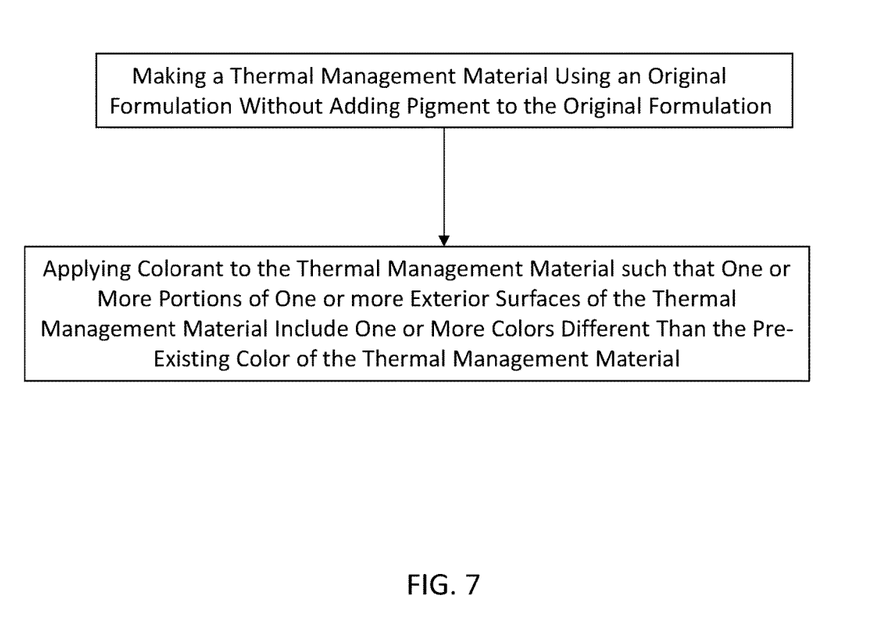
FIG. 7 is a process flow diagram of an exemplary method of providing color to a pre-existing thermal management material according to an exemplary embodiment that includes making a thermal management material using an original formulation without adding pigment to the original formulation to thereby provide a pre-existing thermal management material, and then applying one or more colorants to one or more portions of one or more exterior surfaces of the pre-existing thermal management material such that the one or more portions include one or more colors different than the pre-existing color of the pre-existing thermal management material.

In exemplary embodiments, coloring or colorant (e.g., ink, film, dielectric material, other coloring substance, etc.) is provided on one or more exterior surfaces of an existing thermal management and/or EMI mitigation material. For example, an exemplary method (e.g., FIG. 7, etc.) generally includes providing color to or coloring only one or more exterior surfaces (or one or more surface portions thereof) of a thermal interface material instead of changing the color of an entire thermal interface material by altering the TIM formulation, e.g., adding pigment to the formulation, etc.

In exemplary embodiments (e.g., FIG. 6, etc.), a thermal management and/or EMI mitigation material has one or more exterior surfaces that are customized by applying one or more colorants to the one or more exterior surfaces. For example, only the top surface may be modified or colored so as to have one or more colors different than the material's pre-existing color (e.g., a natural color of the thermal management and/or EMI mitigation material without any pigment added to the formulation, or a color that is determined by one or more pigments added to the formulation, etc.). Or, for example, either or both of the material's oppositely facing upper and lower surfaces may be modified or colored so as to have one or more colors different than a pre-existing color of the thermal management and/or EMI mitigation material. As yet another example, all exterior surfaces of the thermal management and/or EMI mitigation material may be modified or colored so as to have one or more colors different than a pre-existing color of the thermal management and/or EMI mitigation material. In a further example, all of the exterior surfaces except either or both of the opposite exterior end surfaces may be modified or colored so as to have one or more colors different than a pre-existing color of the thermal management and/or EMI mitigation material.

The particular color(s) or pattern of colors provided to an exterior surface(s) may vary, for example, depending on the particular automated visual equipment that will be used to detect the presence of the material and its proper placement (e.g., relative to a printed circuit board, electronic components, heat sink, heat spreader, etc.), preferences of the customer and/or end user, a particular application in which the material will be used, etc. By way of example, an entire exterior surface may be modified or colored so as to have the same or consistent color (e.g., same even or solid color that is not shaded or variegated, etc.) or substantially the same color (e.g., a substantially same even or solid color with at least some shading, variegation, or color variation, etc.). By way of further example, only a portion or less than all of an exterior surface may be modified or colored such that the remainder of the exterior surface remains the pre-existing color of the thermal management and/or EMI mitigation material. As yet another example, an exterior surface may be modified to have a pattern of one or more colors (e.g., striped pattern, polka dot pattern, etc.), such as a pattern of two or more custom colors, a pattern defined by the pre-existing color of the thermal management and/or EMI mitigation material and one or more other colors, etc.

A further example includes an exterior surface(s) of a thermal management and/or EMI mitigation material that may be modified using a laser (e.g., a fiber laser technique, etc.) to provide a laser marking along the exterior surface, such as a laser marking that defines a company name, a product name, a part number, a barcode, a universal product code (UPC), a quick response (QR) code, a logo, one or more alphanumeric characters, etc. The laser marking may be distinguishable from the pre-existing color of the thermal management and/or EMI mitigation material. For example, a laser marking may be dark black or gray, and the pre-existing color may be green. In addition, the thermal management and/or EMI mitigation material may have one or more laser markings on a first side that are different than laser markings on the other sides of the thermal management and/or EMI mitigation material. In addition, or alternatively, other means besides laser markings (e.g., silicone-based ink, etc.) may be used along an exterior surface of a thermal management and/or EMI mitigation material to define a company name, a product name, a part number, a barcode, a universal product code (UPC), a quick response (QR) code, a logo, one or more alphanumeric characters, etc. may be provided on a surface of a of a thermal management and/or EMI mitigation material.

In an exemplary embodiment, a fiber laser is used to provide one or more laser markings along an exterior surface(s) of a thermal management and/or EMI mitigation material. Advantageously, the fiber laser may be capable of creating the laser marking without excessively gouging the exterior surface(s), without making excessively deep marks in the exterior surface, and without creating too much surface debris. A laser also may provide the ability to raster over a relatively large area compared to some continuous inkjet marking systems.

In another exemplary embodiment, a thermal management and/or EMI mitigation material comprises a compliant or conformable thermally-conductive silicone pad having exterior surfaces. A thin layer of color may be provided only on the top exterior surface of the silicone pad. For example, a silicone based ink may be applied to the top exterior surface, which ink will adhere to the silicone pad. After the ink is cured, a relatively tough, thin layer of color is formed by the cured ink along the top surface of the silicone pad. The thin layer of color is stretchable and moveable along with the silicone pad. In some exemplary embodiments, the thin layer of color may be dielectric and not electrically conductive.

Various methods may be used for applying a silicone based ink or other ink to an exterior surface(s) of a thermal management and/or EMI mitigation material in exemplary embodiments. For example, a silicone based ink may be applied via spray coating, ink jet printing, a print nozzle, brushing, screen printing, pad printing, stencil printing, roller coating, printing through mesh, other printing methods, etc. The ink may be deposited, dispensed, or applied before or after die cutting the thermal management and/or EMI mitigation material. In other exemplary embodiments, a thin continuous colored film may be applied to an exterior surface(s) of a thermal management and/or EMI mitigation material. The ink or film may be applied so as to provide a color in a pattern, to provide a color that defines a logo, company name, product name, part number, barcode, universal product code (UPC), quick response (QR) code, one or more alphanumeric characters, etc., or to provide a color consistent across an entire exterior surface, etc.

By way of example, an exemplary embodiment may include a CHT silicone ink available from AIM Screenprinting Supply that is printed through mesh (e.g., mesh ranging from 86 to 160 threads per inch. (32-64 threads per centimeter), etc.) onto an exterior surface(s) of a thermal management and/or EMI mitigation material and then flash cured (e.g., at a temperature no higher than 140 degrees Fahrenheit and for no longer than 3 seconds, etc.). By way of background, CHT silicone ink is a two part system that includes a white, neutral Base, 12 opaque pigments, and four fluorescent pigments. The system is polyvinyl chloride (PVC) and phthalate free. The silicone ink may include one or more additives, such as a catalyst, a thickener for increasing viscosity or a thinner for decreasing viscosity, and an anti-migration additive.

Also by way of example, another exemplary embodiment may include a SYLUB Ink System available from Silicone Inks Ltd. In this example, the ink may be screen printed or applied by pad printing, spraying, etc. to an exterior surface(s) of a thermal management and/or EMI mitigation material. The ink may comprise vinyl polydimethylsiloxane with platinum catalyst and pigments.

As yet another example, a further exemplary embodiment may include a colored polyurethane or silicone transfer film, where the colored film is laminated to an exterior surface of a thermal management and/or EMI mitigation material before or after curing of the silicone body of the thermal management and/or EMI mitigation material. Alternative embodiments may include other suitable inks and/or other suitable colored films.

In exemplary embodiments, the color(s) (e.g., colorants, etc.) and/or markings (e.g., laser markings, etc.) may be added to exterior surface(s) of a thermal management and/or EMI mitigation material without significantly impacting the thermal resistance (e.g., less than 10% increase in thermal resistance, etc.). For example, an exemplary embodiment includes adding a very thin layer so as to not significantly impact thermal resistance. By way of example, a silicone based ink may be applied to an exterior surface(s) of a thermal management and/or EMI mitigation material such that the cured ink forms a colored layer less than 1 mil thick on the exterior surface. Or, for example, a colored film having a thickness less than 1 mil may be applied to an exterior surface(s) of a thermal management and/or EMI mitigation material. As a further example, an exterior surface(s) of a thermal management and/or EMI mitigation material may be coated with a colorant such that the resultant coating has a thickness less than 1 mil thick. As yet another example, an exterior surface(s) of a thermal management and/or EMI mitigation material may be modified to include one or more laser markings thereon.

Furthermore, it is sometimes beneficial that a thermal management and/or EMI mitigation material be non-tacky on one side for handling and easy release during rework. As disclosed herein for exemplary embodiments, colorant (e.g., an ink, a film, a dielectric material, etc.) may be applied directly to an exterior surface(s) of a thermal management and/or EMI mitigation material. The colorant may be naturally non-tacky. In which case, the colored exterior surface of the thermal management and/or EMI mitigation material is less tacky than the underlying thermal management and/or EMI mitigation material, which, in turn, may then allow the thermal management and/or EMI mitigation material to release easily, e.g., cleanly, during rework. For example, the colored exterior surface may allow the thermal management and/or EMI mitigation material to be readily removed from another component, e.g., without adhering to and leaving a residue on the other component at room temperature, etc. In an exemplary embodiment, an exterior surface(s) of a thermal management and/or EMI mitigation material may have a non-tacky colorant in a pattern (e.g., lines, dots, stripes, polka dots, etc.) that would allow for custom tack level of the thermal management and/or EMI mitigation material, e.g., 50% of the exterior surface may be covered with non-tacky colorant (e.g., in lines or dots, etc.) to thereby reduce the surface tack of the thermal management and/or EMI mitigation material by 50%, etc.

Although the colorant may be non-tacky in some exemplary embodiments, the colorant may be put down in such a thin layer that the colored surface may still remain tacky due to the oils of the underlying gap filler coming through in some exemplary embodiments. This may be advantageous in some cases where natural tack is desired. Also, this may advantageously allow for low thermal resistance because the interfacial contact resistance is still low because the pad surface still wets the substrates effectively. The colorant and/or exterior surface of the thermal management and/or EMI mitigation material provided with the colorant may be naturally tacky or non-tacky depending on the particular embodiment, e.g., materials selected, thickness of the color layer, etc.

A thermal interface material may have a natural grey color (e.g., thermal interface material 100 shown in FIG. 1, etc.) such as when no pigments have been added. According to exemplary embodiments disclosed herein, a thermal interface material may have one or more exterior surface(s) that are modified or custom colored according to exemplary embodiments. For example, one or more portions of (or the entirety of) one or more of (or all of) a thermal interface material's naturally grey colored exterior surface(s) may be modified or custom colored to be green (e.g., thermal interface material 200 shown in FIG. 2, etc.), blue (e.g., thermal interface material 300 shown in FIG. 3, etc.), or black (e.g., thermal interface material 400 shown in FIG. 4, etc.). Table 1 below provides thermal resistance measurements obtained from four exemplary thermal interface materials 100, 200, 300, 400 shown in FIGS. 1, 2, 3, and 4. These test specimens and test data, however, are illustrative only and do not limit this disclosure as other exemplary embodiments may be configured differently, e.g., in different colors, have different thermal resistances, etc.

Figure 1:
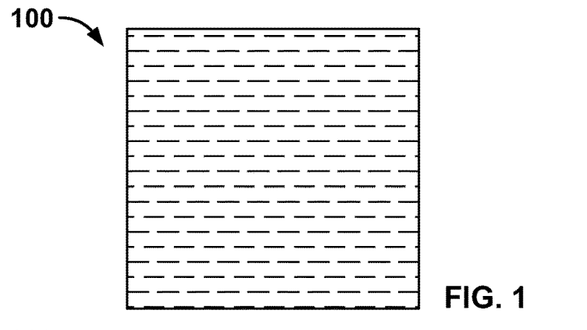
FIG. 1 shows a thermal interface material in its pre-existing natural grey color with no coloring pigment added.
Figure 2:
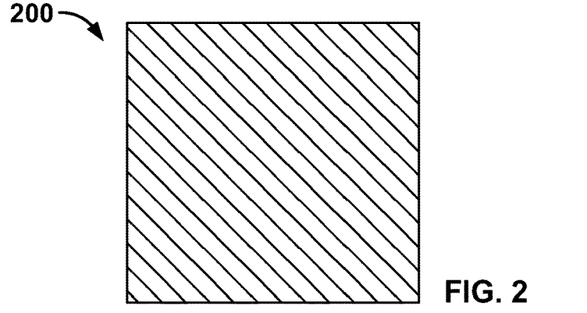
FIG. 2 shows a thermal interface material having a green exterior surface custom colored or modified according to an exemplary embodiment.
Figure 3:
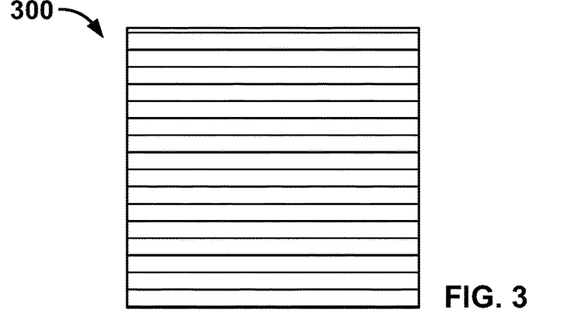
FIG. 3 shows a thermal interface material having a blue exterior surface custom colored or modified according to an exemplary embodiment.
Figure 4:
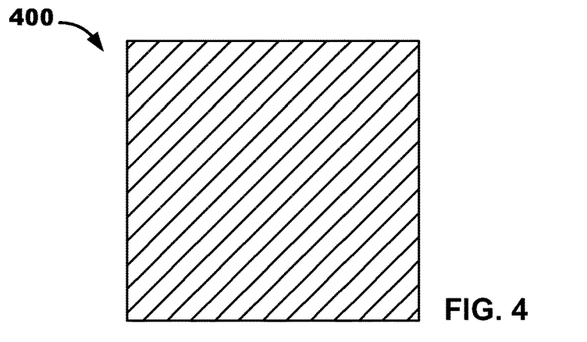
FIG. 4 shows a thermal interface material having a black exterior surface custom colored or modified according to an exemplary embodiment.

More specifically, all four thermal interface materials 100, 200, 300, 400 shown in FIGS. 1 through 4 were Tflex™ 700 thermal gap filler from Laird. By way of background, the Tflex™ 700 thermal gap filler is a filled silicone sheet having a thermal conductivity of about 5 W/mK, high compliancy, and other properties shown in Table 2 below. The thermal interface material 100 labeled Tflex™ 700 Control in Table 1 below did not have any coloring pigment added and had a natural grey color as shown in FIG. 1. The three other thermal interface materials 200, 400, 300 respectively labeled Tflex™ 700 Green Coating, Tflex™ 700 Black Coating, and Tflex™ 700 Blue Coating in Table 1 below had exterior surfaces custom colored with respective green, black, and blue silicone-based ink according to exemplary embodiments.

Thermal resistance was measured for each of the four thermal interface materials 100, 200, 300, 400 having the respective thickness dimensions in millimeters (mm) and mils set forth in the table below. The testing was performed using a LonGwin test stand at a temperature of 50 degrees Celsius (° C.) and constant pressure of 10 pounds per square inch (psi). As shown by the testing, the thermal resistance in degrees Celsius inch squared per Watt (° C.·in$^2$/W) did not increase significantly due to the addition of color to the Tflex™ 700 thermal interface material. Moreover, some of the increase in thermal resistance for the coated pads is due to the pads being thicker and not just because they have a color on their exterior surfaces.

TABLE 1

| Sample | Thermal Resistance (° C.· in$^2$/W) | Measured Thickness During Test (mm) | Measured Thickness During Test (mils) |
|---|---|---|---|
| Tflex ™ 700 Control | 0.714 | 1.803 | 72.12 |
| Tflex ™ 700 Green coating | 0.784 | 1.813 | 72.52 |
| Tflex ™ 700 Black coating | 0.797 | 1.849 | 73.96 |
| Tflex ™ 700 Blue coating | 0.805 | 1.854 | 74.16 |

TABLE 2

| | TFlex ™ 700 | TEST METHOD |
|---|---|---|
| Construction | Filled Silicone Sheet | |
| Color | Dark Grey | Visual |
| Thermal Conductivity (W/mK) | 5.0 | Hot Disk ™ |
| Hardness (Shore 00) | 66; 3 | ASTM D2240 |
| Specific Gravity | 1.73 | Helium Pyncometer |
| Thickness Range | 0.020"-.200" 0.5 mm-5.0 mm | |
| Thickness Tolerance | +/−10% | |
| UL Flammability Rating | 94 V0 | UL |
| Temperature Range | −45° C. to 200° C. | |
| Volume Resistivity (ohm-cm) | 1 × 10$^{13}$ | ASTM D257 |
| Outgassing TML | 1.0% | ASTM E595 |
| Outgassing CVCM | 0.13% | ASTM E595 |

Figure 5:
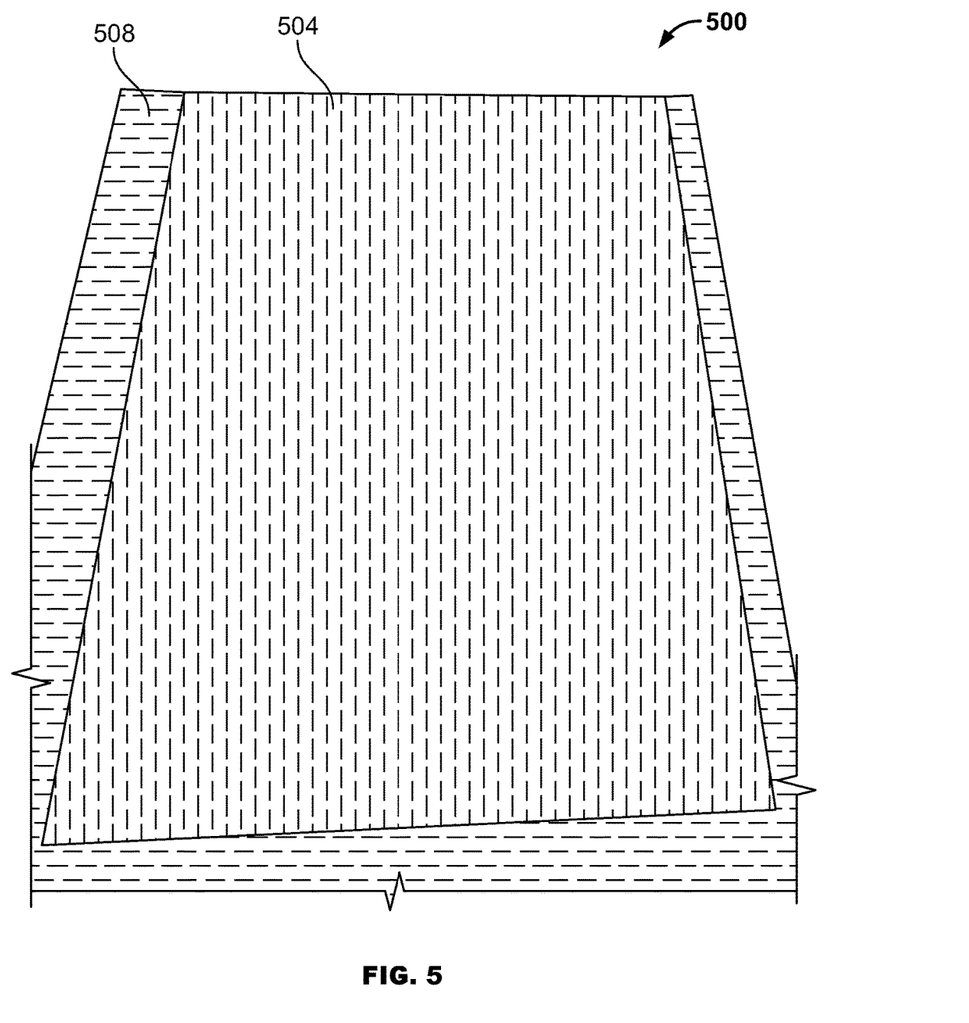
FIG. 5 shows a thermal interface material having a pink exterior surface custom colored or modified according to an exemplary embodiment.
Figure 6:
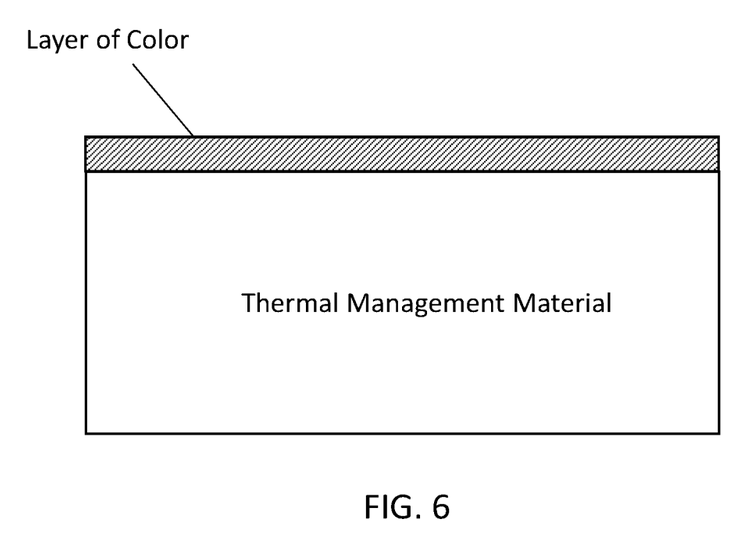
FIG. 6 is a cross-sectional view of an exemplary embodiment of a thermal management material according to an exemplary embodiment in which at least a portion of a top exterior surface of the thermal management material has been modified with one or more colorants (e.g., silicone based ink, etc.) to include a layer of color different than a pre-existing color of the thermal management material.

Green, blue, and black as used in the examples and Table 1 above are only examples of colors that may be used in exemplary embodiments. Alternative embodiments may include any of wide range of other colors, e.g., pink, violet, etc. For example, FIG. 5 shows a thermal interface material 500 having a natural grey color when no pigments have been added. In this exemplary embodiment, one or more portions 508 of (or the entirety of) of one or more of (or all of) the thermal interface material's naturally grey colored exterior surface(s) 512 may be modified or custom colored with pink silicone-based ink, such as a CHT silicone ink described above, etc. In this example, the thermal interface material 500 shown in FIG. 5 was Tflex™ HR6100 thermal gap filler from Laird. By way of background, the Tflex™ HR6100 thermal gap filler is a filled silicone elastomer that has a thermal conductivity of about 3 W/mK, is compliant, has a low modulus, and other properties shown in Table 3 below.

TABLE 3

| | Tflex ™ HR600 | Test Method |
|---|---|---|
| Construction | Filled silicone elastomer | NA |
| Color | Dark Grey | Visual |
| Thermal conductivity | 3 W/mK | ASTM D5470 |
| Hardness (Shore 00) | 40 (at 3 second delay) | ASTM D2240 |
| Density | 2.5 g/cc | Helium Pyncometer |
| Thickness range | 0.010"-.200" (0.25-5.0 mm) | |
| Thickness tolerance | ±10% | |
| UL flammability rating | 94 V0 | UL |
| Temperature range | −45° C. TO 200° C. | NA |
| Volume resistivity | 10^13 ohm-cm | ASTM D257 |
| Outgassing TML | 0.19% | ASTM E595 |
| Outgassing CVCM | 0.07% | ASTM E595 |
| Coefficient Thermal Expansion (CTE) | 217 ppm/C. | IPC-TM-650 2.4.24 |

Exemplary embodiments may provide one or more (but not necessarily any or all) of the following advantages. As just noted, the added coloring to a thermal management and/or EMI mitigation material may allow for an easy and clean release of the material during rework, repair, replacement, etc. This may also allow for easier handling and installation by inhibiting adherence, stickiness or tacky surface tack, such as to the hands of the installer or to a surface of a component. Adding color and/or markings (e.g., laser marking, ink, colored film, etc.) to only the exterior surfaces of thermal management and/or EMI mitigation materials (e.g., thermally-conductive gap fillers or pads, EMI absorbers, etc.) also allows color specifications or requirements (e.g., requested by a customer, etc.) to be met without having to modify the original material formulation. Because the original formulation does not need to be modified by pigments, exemplary embodiments disclosed herein allow greater flexibility in terms of the range of colors that may be provided to exterior surfaces of thermal management and/or EMI mitigation materials. In contrast, a conventional method of changing the color of a thermal interface material requires the addition of pigment or replacement of a pigment in a TIM formulation. Because pigments contain particles, the addition or replacement of pigments in a TIM can impact the particle packing of the system and is not a trivial matter. Furthermore, maintaining stock of one formulation in several colors is not efficient business.

In some exemplary embodiments, the color (e.g., violet, etc.) added to the material's exterior surface(s) may allow a visual or automated detection system to more readily confirm the presence and placement of the material. For example, some visual or automated detection systems can more easily detect certain colors like violet rather than grey. A coloring scheme applied to the exterior surface(s) of a thermal management and/or EMI mitigation material may also allow an installer to more quickly and easily determine the proper orientation for installing the material, such as which side of the material should be placed in contact with a heat sink and which side should be placed in contact with a heat source or heat-generating electronic component.

A wide range of thermal management and/or EMI mitigation materials may have their exterior surfaces modified or colored in accordance with exemplary embodiments disclosed herein. Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc. Example embodiments may include one or more thermal interface materials of Laird, such as any one or more of the Tflex™ series gap fillers (e.g., Tflex™ 300 series thermal gap filler materials, Tflex™ 600 series thermal gap filler materials, Tflex™ HR600 series thermal gap filler materials, Tflex™ 700 series thermal gap filler materials, etc.), Tpcm™ series thermal phase change materials (e.g., Tpcm™ 580 series phase change materials, etc.), Tpli™ series gap fillers (e.g., Tpli™ 200 series gap fillers, etc.), IceKap™ series thermal interface materials, CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), Q-ZORB™ microwave absorbing elastomer (e.g., Q-ZORB™ HP (high permeability), Q-ZORB™ HF (high frequency), etc.), foam absorbers (e.g., RFLS™ single layer lossy foam absorber sheet, Lossy sheets, RFRET™ reticulated foam based absorber, etc.), etc.

In an exemplary embodiment, the thermal management and/or EMI mitigation material comprises a Q-ZORB™ HF (high frequency) surface wave absorber that is a relatively thin, magnetically loaded elastomeric sheet designed to provide attenuation at high angles of incidence for surface wave attenuation. The Q-ZORB™ HF surface wave absorber is silicone-based, meets the UL V0 fire retardant requirement, is RoHS compliant, and may have the properties listed in Table 4 below.

TABLE 4

| SIZE | THICKNESS | WEIGHT | TEMPERATURE MAXIMUM | ELECTRICAL PERFORMANCE | COLOR | | BONDING | FIRE RETARDANT RATING |
|---|---|---|---|---|---|---|---|---|
| 24" × 24" (Standard) 12" × 12" 4" × 6" | 0.20" nominal (.5 mm) | .50 lb/sq. ft. | 300° F | 12-18 GHz | Gray | RoHS Compliant Sulfur-free | Supplied with 3M 90485 PSA | UL V0 |

TABLE 4-continued

| SIZE | THICKNESS | WEIGHT | TEMPERATURE MAXIMUM | ELECTRICAL PERFORMANCE | COLOR | | BONDING | FIRE RETARDANT RATING |
|---|---|---|---|---|---|---|---|---|
| 24" × 24" (Standard) 12" × 12" 4" × 6" | .040" nominal (1 mm) | .94 lb/sq. ft. | 300° F | 8-18 GHz | Gray | Good general weather and chemical resistance Sulfur-free | Supplied with 3M 9485 PSA | UL V0 |
| 24" × 24" (Standard) 12" × 12" 4" × 6" | 0.60" nominal (1.5 mm) | 1.2 lb/sq. ft. | 300° F | 4-18 GHz Excellent for surface current attenuation | Gray | Good general weather and chemical resistance Sulfur-free | Supplied with 3M 9485 PSA | UL V0 |
| 24" × 24" (Standard) 12" × 12" 4" × 6" | .125" nominal (3.2 mm) | 2.75 lb/sq. ft. | 300° F | 1-18 GHz Excellent for surface current attenuation | Gray | Good general weather and chemical resistance Sulfur-free | Supplied with 3M 9485 PSA | UL V0 |

In an exemplary embodiment, the thermal management and/or EMI mitigation material comprises a Q-ZORB™ HP (high permeability) product. The Q-ZORB™ HP product includes magnetic fillers in a polymeric binder to produce a relative thin sheet with excellent low frequency performance. The Q-ZORB™ HP product has a relatively high permeability along with low frequency magnetic loss. This allows relatively thin sheets of material to perform at frequencies below 2 GHz. The Q-ZORB™ HP product meets the UL V0 fire retardant requirement, is RoHS compliant, and may have the properties listed in Table 5 below.

TABLE 5

TYPICAL PHYSICAL PROPERTIES

| Size | 3535 | .006" × 12" × 13" |
| | 3535-S | .006" × 4" × 6" |
| | 3536 | .020" × 12" × 13" |
| | 3536-S | .020" × 4" × 6" |
| Permeability µ' (1 MHz) | | 37 |
| Electrical resistivity (Ω/□) | | 6 × 10$^{10}$ |
| Specific gravity | | 3.1 |
| Tensile strength (MPa) | | 1.9 |
| Hardness (DurometerA) | | 70 ± 10% |
| Thermal conductivity (W/mk) | | 1.0 |
| Flammability | | UL94 V-0 |

In an exemplary embodiment, the thermal management and/or EMI mitigation material comprises a RFRET™ reticulated foam based absorber. The RFRET™ reticulated foam based absorber may have the properties listed in Table 6 below.

TABLE 6

TYPICAL PHYSICAL PROPERTIES

| Size | 4106 | 24" × 24" (Standard) |
| | 4106-.25 | 12" × 12" |
| | 4106-S | 4" × 6" |
| Thickness | | 0.50" nominal |
| Weight | | .092 lb/sq. ft. |
| Temperature Maximum | | 250° F. |
| Color | | Gray |
| Environmental | | Withstands intermittent exposure to water without degradation |

In an exemplary embodiment, the thermal management and/or EMI mitigation material comprises a RFLS™ single layer lossy foam absorber sheet. The RFLS™ single layer lossy foam absorber sheet may have the properties listed in Table 7 below.

TABLE 7

| Part No. | Size | Thickness | Temperature Range | Color | Environmental | Bonding |
|---|---|---|---|---|---|---|
| 5092 | 24" × 24" (Standard) | 0.25" nominal | −85-250° F. | Black | RoHS Compliant | Supplied with 3M 9485 PSA |
| 5092-.25 | 12" × 12" | | | | | |
| 5092-S | 4" × 6" | | | | | |
| 5206 | 24" × 24" (Standard) | 0.125" nominal | −85-250° F. | Black | RoHS Compliant | Supplied with 3M 9485 PSA |
| 5206-.25 | 12" × 12" | | | | | |
| 5206-S | 4" × 6" | | | | | |

In an exemplary embodiment, the thermal management and/or EMI mitigation material comprises a CoolZorb™ 400 thermally conductive microwave absorber. The CoolZorb™ 400 thermally conductive microwave absorber is a hybrid absorber/thermal management material that may be used for EMI mitigation, e.g., board level EMI noise reduction, etc. The CoolZorb™ 400 thermally conductive microwave absorber may be used like a traditional thermal interface material between heat source such as an integrated circuit (IC) and a heat sink or other heat transfer device or metal chassis. The CoolZorb™ 400 thermally conductive microwave absorber may function to suppress unwanted energy coupling, resonances or surface currents causing board level EMI issues. The CoolZorb™ 400 thermally conductive microwave absorber may include a silicone gel binder that imparts inherent tack typical of standard thermal gap fillers. The filler particle composition may impart both good thermal conductivity and EMI suppression in the microwave frequency range with best attenuation performance at or above 5 GHz. The CoolZorb™ 400 thermally conductive microwave absorber may have the properties listed in Table 8 below.

TABLE 8

| TYPICAL PROPERTIES | DATA | TEST METHOD |
|---|---|---|
| Color | Dark gray | Visual |
| Thermal conductivity | 2.0 W/m-K | ASTM D5470 |
| Density | 4.5 g/cc | ASTM D792 |
| Hardness | 56 Shore 00 | ASTM D2240 |
| Tensile strength | 60 psi | ASTM D638 |
| Temperature Range | −20° C. to 100° C. | NA |
| UL Flammability | UL94V0 | UL |
| Volume resistivity | $5.9 \times 10^{1\circ}$ Ω | ASTM D257 |
| Outgassing (TML) | 0.15% | ASTM E595-07 |
| Outgassing (CVCM) | 0.06% | ASTM E595-07 |
| Coefficient of Thermal Expansion (CTE) | 186 μm/mC | IPC-TM-650 2.4.41 |
| Standard Thickness range | .020"-.130" (0.5-3.3 mm) | |
| Thickness Tolerance | +/−.005" (+/−.127 mm) | |

In an exemplary embodiment, the thermal management and/or EMI mitigation material comprises a CoolZorb™ 500 thermally conductive microwave absorber. The CoolZorb™ 500 thermally conductive microwave absorber is a hybrid absorber/thermal management material that may be used for EMI mitigation, e.g., board level EMI noise reduction, etc. The CoolZorb™ 500 thermally conductive microwave absorber may be used like a traditional thermal interface material between heat source such as an integrated circuit (IC) and a heat sink or other heat transfer device or metal chassis. The CoolZorb™ 500 thermally conductive microwave absorber may function to suppress unwanted energy coupling, resonances or surface currents causing board level EMI issues. The CoolZorb™ 500 thermally conductive microwave absorber may include a silicone gel binder that imparts inherent tack typical of standard thermal gap fillers. The filler particle composition may impart both good thermal conductivity and EMI suppression in the microwave frequency range with best attenuation performance at or above 5 GHz. The CoolZorb™ 500 thermally conductive microwave absorber may have the properties listed in Table 9 below.

TABLE 9

| TYPICAL PROPERTIES | DATA | TEST METHOD |
|---|---|---|
| Color | Dark gray | Visual |
| Thermal conductivity | 4.0 W/m-K | ASTM D5470 |
| Density | 3.4 g/cc | ASTM D792 |
| Hardness | 55 Shore 00 | ASTM D2240 |
| Tensile strength | 45 psi | ASTM D638 |
| Temperature Range | −40° C. to 175° C. | NA |
| UL Flammability | UL94V0 | UL |
| Volume resistivity | $1 \times 10^{11}$ Ω*cm | ASTM D257 |
| Outgassing (TML) | 0.093% | ASTM E595-07 |
| Outgassing (CVCM) | 0.011% | ASTM E595-07 |
| Coefficient of Thermal Expansion (CTE) | 118 μm/mC | IPC-TM-650 2.4.41 |
| EMI Attenuation @ 5 GHz | 9.4 dB/cm | |
| EMI Attenuation @ 15 GHz | 17.3 dB/cm | |
| Standard Thickness range | .020"-.125" (0.5-3.1 mm) | |
| Thickness Tolerance | +/−.005" (+/−.127 mm) | |

In an exemplary embodiment, the thermal management and/or EMI mitigation material comprises a CoolZorb™ 600 thermally conductive microwave absorber. The CoolZorb™ 600 thermally conductive microwave absorber is a hybrid absorber/thermal management material that may be used for EMI mitigation, e.g., board level EMI noise reduction, etc. The CoolZorb™ 600 thermally conductive microwave absorber may be used like a traditional thermal interface material between heat source such as an integrated circuit (IC) and a heat sink or other heat transfer device or metal chassis. The CoolZorb™ 600 thermally conductive microwave absorber may function to suppress unwanted energy coupling, resonances or surface currents causing board level EMI issues. The CoolZorb™ 600 thermally conductive microwave absorber may include a silicone gel binder that imparts inherent tack typical of standard thermal gap fillers. The filler particle composition may impart both good thermal conductivity and EMI suppression in the microwave frequency range with best attenuation performance at or above 3 GHz. The CoolZorb™ 600 thermally conductive microwave absorber may have the properties listed in Table 10 below.

TABLE 10

| TYPICAL PROPERTIES | DATA | TEST METHOD |
|---|---|---|
| Color | Dark gray | Visual |
| Thermal conductivity | 3.0 W/m-K | ASTM D5470 |
| Density | 4.1 g/cc | ASTM D792 |
| Hardness | 60 Shore 00 | ASTM D2240 |
| Tensile strength | 50 psi | ASTM D638 |
| Temperature Range | −40° C. to 175° C. | NA |
| UL Flammability | UL94V0 | UL |
| Volume resistivity | $1 \times 10^{12}$ Ω*cm | ASTM D257 |
| Outgassing (TML) | 0.024% | ASTM E595-07 |
| Outgassing (CVCM) | 0.013% | ASTM E595-07 |
| Coefficient of Thermal Expansion (CTE) | 205 μm/mC | IPC-TM-650 2.4.41 |
| EMI Attenuation @ 5 GHz | 18.3 dB/cm | |
| EMI Attenuation @ 15 GHz | 49.8 dB/cm | |
| Standard Thickness range | .020"-.125" (0.5-3.1 mm) | |
| Thickness Tolerance | +/−.005" (+/−.127 mm) | |

By way of further example, a thermal management and/or EMI mitigation material may comprise an elastomer and/or ceramic particles, metal particles, ferrite EMI/RFI absorbing particles, metal or fiberglass meshes in a base of rubber, gel, or wax, etc. A thermal management and/or EMI mitigation material may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. A thermal management and/or EMI mitigation material may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the material to closely conform (e.g., in a relatively close fitting and encapsulating manner, etc.) to a mating surface when placed in contact with the mating surface, including a non-flat, curved, or uneven mating surface. For example, the thermal management and/or EMI mitigation material may have very high compliancy such that the thermal management and/or EMI mitigation material will relatively closely conform to the size and outer shape of an electrical component when the thermal management and/or EMI mitigation material is along an inner surface of a cover of an EMI shield (e.g., a one-piece or two board level shield, etc.) and the thermal management and/or EMI mitigation material is compressed against the electrical component when the EMI shield is installed to a printed circuit board over the electrical component.

A thermal management and/or EMI mitigation material may comprise a soft thermal interface material formed from elastomer and at least one thermally-conductive metal, boron nitride, and/or ceramic filler, such that the soft thermal interface material is conformable even without undergoing a phase change or reflow. The thermal management and/or EMI mitigation material may be a non-metal, non-phase change material that does not include metal and that is conformable even without undergoing a phase change or reflow. A thermal management and/or EMI mitigation material may comprise a thermal interface phase change material. A thermal management and/or EMI mitigation material may comprise a ceramic filled silicone elastomer, boron nitride filled silicone elastomer, fiberglass reinforced gap filler, or a thermal phase change material that includes a generally non-reinforced film.

A thermal management and/or EMI mitigation material may be a non-phase change material and/or be configured to adjust for tolerance or gap by deflection. In some exemplary embodiments, the thermal management and/or EMI mitigation material may comprise a non-phase change gap filler or gap pad that is conformable without having to melt or undergo a phase change. The thermal management and/or EMI mitigation material may be able to adjust for tolerance or gaps by deflecting at low temperatures (e.g., room temperature of 20° C. to 25° C., etc.). The thermal management and/or EMI mitigation material may have a Young's modulus and Hardness Shore value considerably lower than copper or aluminum. The thermal management and/or EMI mitigation material may also have greater percent deflection versus pressure than copper or aluminum.

In some exemplary embodiments, the thermal management and/or EMI mitigation material comprises Tflex™ 300 ceramic filled silicone elastomer gap filler or Tflex™ 600 boron nitride filled silicone elastomer gap filler. Tflex™ 300 ceramic filled silicone elastomer gap filler and Tflex™ 600 boron nitride filled silicone elastomer gap filler have a Shore 00 hardness value (per the ASTM D2240 test method) of about 27 and 25, respectively. In some other exemplary embodiments, the thermal management and/or EMI mitigation material may comprise Tpli™ 200 boron nitride filled, silicone elastomer, fiberglass reinforced gap filler having a Shore 00 hardness of about 70 or 75. Accordingly, exemplary embodiments may include thermal management and/or EMI mitigation materials having a Shore 00 hardness less than 100. Tflex™ 300 series thermal gap filler materials generally include, e.g., ceramic filled silicone elastomer which will deflect to over 50% at pressures of 50 pounds per square inch and other properties shown below. Tflex™ 600 series thermal gap filler materials generally include boron nitride filled silicone elastomer, and have a hardness of 25 Shore 00 or 40 Shore 00 per ASTM D2240. Tpli™ 200 series gap fillers generally include reinforced boron nitride filled silicone elastomer and have a hardness of 75 Shore 00 or 70 Shore 00 per ASTM D2240. Tpcm™ 580 series phase change materials are generally non-reinforced films having a phase change softening temperature of about 122 degrees Fahrenheit (50 degrees Celsius). Other exemplary embodiments may include a thermal management and/or EMI mitigation material with a hardness of less than 25 Shore 00, greater than 75 Shore 00, between 25 and 75 Shore 00, etc.

In some exemplary embodiments, the thermal management and/or EMI mitigation material may comprise a thermally-conductive microwave/RF/EMI absorber that includes silicon carbide. For example, the thermal management and/or EMI mitigation material may include silicon carbide, carbonyl iron powder, and alumina. In some exemplary embodiments, the thermal management and/or EMI mitigation material may further include manganese zinc (MnZn) ferrite and magnetic flakes. The resulting thermally-conductive EMI absorber may have a high thermal conductivity (e.g., at least 2 Watts per meter per Kelvin (W/m-K) or higher, etc.) and high EMI absorption or attenuation (e.g., at least 9 decibels per centimeter (dB/cm) at a frequency of at least 1 GHz, at least 17 dB/cm at a frequency of at least 15 GHz, etc.). In other exemplary embodiments, the thermal management and/or EMI mitigation material may comprise a thermally-conductive EMI absorber that includes one or more other ceramics, and/or other EMI absorbing materials.

Exemplary embodiments may include a thermal management and/or EMI mitigation material having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the material and loading percentage of the thermally conductive filler, if any. These thermal conductivities are only examples as other embodiments may include a thermal management and/or EMI mitigation material with a thermal conductivity higher than 6 W/mK, less than 1 W/mK, or other values between 1 and 6 W/mk. Accordingly, aspects of the present disclosure should not be limited to use with any particular thermal management and/or EMI mitigation material as exemplary embodiments may include a wide range of thermal management and/or EMI mitigation materials.

In exemplary embodiments, a thermal interface material may be used to define or provide part of a thermally-conductive heat path from a heat source to a heat removal/dissipation structure or component. A thermal interface material disclosed herein may be used, for example, to help conduct thermal energy (e.g., heat, etc.) away from a heat source of an electronic device (e.g., one or more heat generating components, central processing unit (CPU), die, semiconductor device, etc.). A thermal interface material may be positioned generally between a heat source and a heat removal/dissipation structure or component (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat removal/dissipation structure or component. During operation, the thermal interface material may then function to allow transfer (e.g., to conduct heat, etc.) of heat from the heat source along the thermally-conductive path to the heat removal/dissipation structure or component. In exemplary embodiments in which the thermal interface material is also an EMI absorber, the thermal interface/EMI absorbing material may also be operable for absorbing a portion of the EMI incident upon the thermal interface/EMI absorbing material.

Example embodiments of thermal management and/or EMI mitigation materials disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal management and/or EMI mitigation material or otherwise provides or transfers heat to the thermal management and/or EMI mitigation material regardless of whether the heat is generated by the heat source or merely transferred through or via the heat source. Accordingly, aspects of the present disclosure should not be limited to use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal management material comprising one or more exterior surfaces of the thermal management material, wherein one or more portions of the one or more exterior surfaces modified to include one or more colors different than a pre-existing color of the thermal management material, and wherein:
   the one or more portions of the one or more exterior surfaces include one or more colorants to cause the one or more portions of the one or more exterior surfaces to include the one or more colors different than the pre-existing color of the thermal management material;
   wherein the thermal management material comprises a thermal interface material; and
   wherein the one or more colorants comprise a silicone based ink;
   wherein the silicone based ink is applied to each of the one or more portions of the one or more exterior surfaces;
   wherein the silicone based ink includes a layer of color;
   wherein the layer of color is:
      stretchable and moveable along with the corresponding one or more portions of the one or more exterior surfaces; and
      dielectric; and
      naturally non-tacky such that the one or more portions of the one or more exterior surfaces are releasable easily and cleanly from another surface;
   wherein the layer of color has a thickness less than 1 mil along each of the one or more portions of the one or more exterior surfaces;
   wherein the thermal management material has a thermal conductivity of at least about 2 Watts per meter per Kelvin; and
   the thermal management material has a thermal resistance; and whereby the one or more colorants increase the thermal resistance of the thermal management material by less than 10%.

2. The thermal management material of claim 1, wherein the one or more portions of the one or more exterior surfaces define one or more of a company name, a product name, a part number, a barcode, a universal product code (UPC), a quick response (QR) code, a logo, or one or more alphanumeric characters distinguishable from the pre-existing color of the thermal management material.

3. The thermal management material of claim 1, wherein the one or more portions of the one or more exterior surfaces include the one or more colorants to thereby cause the one or more portions of the one or more exterior surfaces to have one or more colors different than the pre-existing color of the thermal interface material, and wherein the one or more colorants are applied to the one or more portions of the one or more exterior surfaces without adding pigment to or altering an original formulation of the thermal interface material, whereby the pre-existing color of the thermal interface material remains unchanged.

4. The thermal management material of claim 1, wherein the one or more portions of the one or more exterior surfaces are detectable by an automated visual detection system; and wherein:
   the one or more portions of the one or more exterior surfaces define a pattern of different colors; or
   the one or more portions of the one or more exterior surfaces cooperate with the pre-existing color of the thermal management material to define a pattern of colors including the one or more colors of the one or more portions of the one or more exterior surfaces and the pre-existing color of the thermal management material.

5. The thermal management material of claim 1, wherein the pre-existing color of the thermal management material is a natural color of the thermal management material without any pigment added to the thermal management material, or a color determined by one or more pigments added to the thermal management material; and wherein:
   at least two exterior surfaces of the thermal management material are modified to include one or more colors different than the pre-existing color of the thermal management material.

6. The thermal management material of claim 1, wherein the thermal management material comprises:
   a thermally-conductive microwave absorber including silicon carbide, carbonyl iron powder, and alumina; or
   a thermally-conductive microwave absorber including silicon carbide, carbonyl iron powder, alumina, manganese zinc ferrite, and magnetic flakes; or
   a surface wave absorber comprising a magnetically loaded silicone-based elastomeric sheet; or
   a tuned frequency absorber comprising a sheet including one or more magnetic fillers in a polymeric binder; or a thermally-conductive gap filler, a thermally-conductive silicone pad, or a thermally-conductive dielectric material.

7. A method of providing color to a pre-existing thermal management material of claim 1 and having a pre-existing color, the method comprising modifying the one or more portions of the one or more exterior surfaces of the pre-existing thermal management material, such that the one or more portions include one or more colors different than the pre-existing color of the pre-existing thermal management material, wherein modifying the one or more portions of the one or more exterior surfaces of the pre-existing thermal management material comprises applying the one or more colorants to the one or more portions of the one or more exterior surfaces of the pre-existing thermal management material such that the one or more portions have one or more colors different than the pre-existing color of the pre-existing thermal management material.

8. A method of providing color to a pre-existing thermal management material of claim 1 and having a pre-existing color, the method comprising modifying the one or more portions of the one or more exterior surfaces of the pre-existing thermal management material, such that the one or more portions include one or more colors different than the pre-existing color of the pre-existing thermal management material, and
wherein the method further comprises making a thermal management material using an original formulation without adding pigment to the original formulation to thereby provide the pre-existing thermal management material, and then modifying the one or more portions of the one or more exterior surfaces of the pre-existing thermal management material.

9. The thermal management material of claim 1, wherein the thermal management material comprises a compliant or conformable thermally-conductive silicone pad.

10. The thermal management material of claim 9, wherein the layer of color is provided only on a top exterior surface of the compliant or conformable thermally-conductive silicone pad.

11. The thermal management material of claim 1, wherein the one or more portions of the one or more exterior surfaces of the thermal interface material include one or more laser markings, whereby the one or more laser markings increase the thermal resistance of the thermal interface material by less than 10%.

12. The thermal management material of claim 1, wherein:
the thermal interface material has a natural grey color; and
the one or more portions of the one or more exterior surfaces of the thermal interface material are modified to be green, blue, black, pink, or violet, and thereby distinguishable from the natural grey color of the thermal interface material.

13. The thermal management material of claim 1, wherein the thermal interface material thermal paste, a thermal putty, a dispensable thermal interface material, and a thermal pad.

14. The thermal management material of claim 1, wherein the thermal management material comprises a thermal gap filler having a thermal conductive of at least about 2 Watts per meter per Kelvin, the thermal gap filler comprising thermally-conductive filler in a silicone sheet.

15. The thermal management material of claim 1, wherein the thermal management material comprises a thermally-conductive pad having a thermal conductivity of at least about 2 Watts per meter per Kelvin, and a top exterior surface modified so as to have one or more colors different than a pre-existing color of the thermally-conductive pad.

16. The thermal management material of claim 1, wherein the thermal management material comprises:
a surface wave absorber comprising a magnetically loaded silicone-based elastomeric sheet; or
a tuned frequency absorber comprising a sheet including one or more magnetic fillers in a polymeric binder.

17. The thermal management material of claim 1, wherein the thermal management material comprises:
a thermally-conductive microwave absorber including silicon carbide, carbonyl iron powder, and alumina; or
a thermally-conductive microwave absorber including silicon carbide, carbonyl iron powder, alumina, manganese zinc ferrite, and magnetic flakes.

* * * * *

UNITED STATES PATENT AND TRADEMARK OFFICE
CERTIFICATE OF CORRECTION

PATENT NO. : 10,306,817 B2  
APPLICATION NO. : 15/869593  
DATED : May 28, 2019  
INVENTOR(S) : Karen Bruzda et al.

Page 1 of 1

It is certified that error appears in the above-identified patent and that said Letters Patent is hereby corrected as shown below:

In the Claims

Claim 13
Column 22, Line 15: insert --includes one or more of a thermal gap filler, a thermal phase change material, a thermal grease, a-- after "thermal material" and before "thermal paste".

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*